(12) United States Patent
Hui et al.

(10) Patent No.: US 10,096,482 B2
(45) Date of Patent: Oct. 9, 2018

(54) APPARATUS AND METHOD FOR CHEMICAL MECHANICAL POLISHING PROCESS CONTROL

(71) Applicant: Taiwan Semiconductor Manufacturing Company, Ltd., Hsin-Chu (TW)

(72) Inventors: Keung Hui, Hsinchu (TW); Jin-Ning Sung, Pingjhen (TW); Jong-I Mou, Hsinchu (TW); Soon-Kang Huang, Hsin Chu (TW); Yen-Di Tsen, Chung-Ho (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 72 days.

(21) Appl. No.: 14/822,671

(22) Filed: Aug. 10, 2015

(65) Prior Publication Data

US 2015/0348797 A1    Dec. 3, 2015

Related U.S. Application Data

(62) Division of application No. 12/953,584, filed on Nov. 24, 2010, now Pat. No. 9,102,033.

(51) Int. Cl.

| H01L 21/306 | (2006.01) |
|---|---|
| B24B 49/04 | (2006.01) |
| B24B 49/16 | (2006.01) |
| B24B 37/005 | (2012.01) |
| B24B 37/04 | (2012.01) |
| B24B 37/10 | (2012.01) |
| B24B 49/02 | (2006.01) |
| B24B 51/00 | (2006.01) |
| H01L 21/66 | (2006.01) |

(52) U.S. Cl.
CPC ...... *H01L 21/30625* (2013.01); *B24B 37/005* (2013.01); *B24B 37/042* (2013.01); *B24B 37/107* (2013.01); *B24B 49/02* (2013.01); *B24B 49/04* (2013.01); *B24B 49/16* (2013.01); *B24B 51/00* (2013.01); *H01L 22/12* (2013.01); *H01L 22/20* (2013.01); *H01L 2924/0002* (2013.01)

(58) Field of Classification Search
None
See application file for complete search history.

(56) References Cited

U.S. PATENT DOCUMENTS

| 6,213,847 B1* | 4/2001 | Torii ..................... B24B 1/00 |
|---|---|---|
| | | 257/E21.244 |
| 6,276,989 B1 | 8/2001 | Campbell et al. |
| 6,354,926 B1 | 3/2002 | Walsh |

(Continued)

*Primary Examiner* — Sylvia MacArthur
(74) *Attorney, Agent, or Firm* — Haynes and Boone, LLP

(57) ABSTRACT

An apparatus and method for providing target thickness and surface profile uniformity control of a multi-head chemical mechanical polishing (CMP) process is disclosed. An exemplary method includes providing at least two wafers; determining a surface profile of each of the at least two wafers; determining an operation mode for a chemical mechanical polishing (CMP) process based on the surface profiles of the at least two wafers; determining a CMP polishing recipe for each of the at least two wafers based on the operation mode; and performing the CMP process on the at least two wafers based on the determined CMP polishing recipes.

20 Claims, 12 Drawing Sheets

(56) References Cited

U.S. PATENT DOCUMENTS

| | | | |
|---|---|---|---|
| 6,776,692 B1* | 8/2004 | Zuniga | B24B 37/013 451/11 |
| 7,004,814 B2* | 2/2006 | Chen | B24B 49/00 156/345.12 |
| 7,354,332 B2* | 4/2008 | Surana | B24B 37/16 451/10 |
| 2002/0151259 A1* | 10/2002 | Hirokawa | B24B 37/013 451/285 |
| 2007/0155284 A1* | 7/2007 | Ring | B24B 37/013 451/5 |
| 2009/0239446 A1* | 9/2009 | Fukuda | B24B 37/005 451/5 |
| 2010/0035527 A1 | 2/2010 | Jindal et al. | |
| 2010/0093259 A1 | 4/2010 | Lee et al. | |
| 2011/0189856 A1* | 8/2011 | Xu | B24B 37/013 438/692 |
| 2011/0300776 A1* | 12/2011 | Mai | B24B 37/042 451/28 |
| 2015/0348797 A1* | 12/2015 | Hui | B24B 37/005 438/692 |

\* cited by examiner

APPARATUS AND METHOD FOR CHEMICAL MECHANICAL POLISHING PROCESS CONTROL

CROSS-REFERENCE TO RELATED APPLICATIONS

This application is a divisional of U.S. application Ser. No. 12/953,584, filed on Nov. 24, 2010, titled "Apparatus and Method for Target Thickness and Surface Profile Uniformity Control of Multi-Head Chemical Mechanical Polishing Process", the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, wafer surface planarization has become critical. Conventional methods for ensuring wafer surface uniformity (both within-wafer uniformity and wafer-to-wafer uniformity) focus on achieving mean target thickness control. However, as device scaling continues, variations across the wafer surfaces are becoming significant, presenting a need for closely controlled target thickness and surface profile uniformity. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
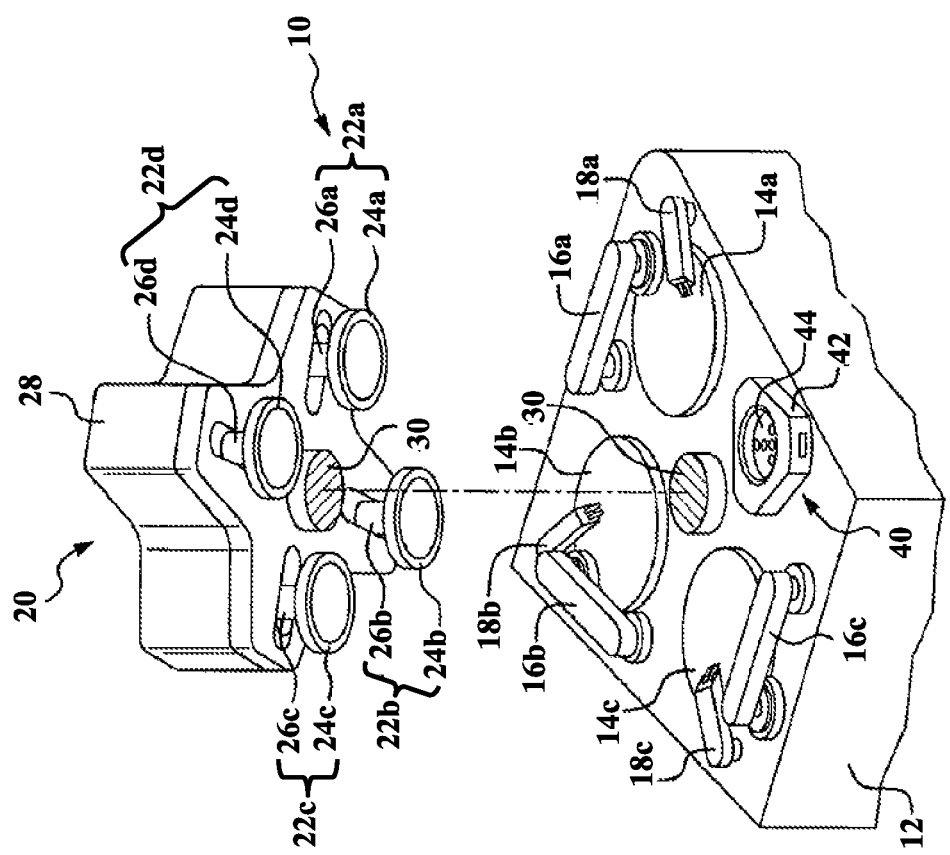
FIG. 1 is a diagrammatic perspective view of a chemical mechanical polishing (CMP) apparatus that embodies various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic perspective view of a chemical mechanical polishing (CMP) apparatus 10 that embodies various aspects of the present disclosure. FIG. 1 is not a comprehensive diagram of the entire apparatus. Instead, for simplicity and clarity, FIG. 1 shows only selected portions of the overall apparatus that facilitate an understanding of aspects of the present disclosure. Additional features can be added in the CMP apparatus 10, and some of the features described below can be replaced or eliminated for other embodiments of the CMP apparatus 10.

The CMP apparatus 10 includes a base 12 having polishing pad/platen assemblies 14a, 14b, and 14c (which include a polishing pad affixed to a platen) disposed thereon. The three depicted polishing pad/platen assemblies 14a, 14b, and 14c are for illustration purposes only, and it is understood that alternative embodiments may include a single polishing pad/platen assembly, such as polishing pad/platen assembly 14a alone, or more than three polishing pad/platen assemblies. Each of the polishing pad/platen assemblies 14a, 14b, and 14c may be mounted on a not illustrated rotatable carousel. The polishing pad/platen assemblies 14a, 14b, and 14c facilitate simultaneous processing of multiple wafers. A wafer is a substrate (for example, a semiconductor substrate), a mask (also referred to as a photomask or reticle), or any base material on which processing is conducted to provide layers of material to form various features of an integrated circuit (IC) device. In the depicted embodiment, pad conditioners 16a, 16b, and 16c are provided on the base 10, which can be swept over respective polishing pads to condition the polishing pads. Slurry supply arms 18a, 18b, and 18c are further provided on the base 10 for supplying slurry to surfaces of respective polishing pads.

The CMP apparatus 10 also includes a head rotation unit 20 having wafer head assemblies 22a, 22b, 22c, and 22d for holding and fixedly rotating the wafers on the polishing pad/platen assemblies 14a, 14b, and 14c. As with the polishing pad/platen assemblies 14a, 14b, and 14c, the four depicted wafer head assemblies 22a, 22b, 22c, and 22d are for illustration purposes only, and it is understood that alternative embodiments may include a single wafer head assembly, two wafer head assemblies, or more than four wafer head assemblies. The wafer head assemblies 22a, 22b, 22c, and 22d include respective retention rings 24a, 24b, 24c, and 24d mounted on respective rotation shafts 26a, 26b, 26c, and 26d, which are rotated by a driving mechanism (not shown) inside a frame 28 of the head rotation unit 20. The wafer head assemblies 22a, 22b, 22c, and 22d hold wafers and press the wafers against top surfaces of polishing pads of the polishing pad/platen assemblies 14a, 14b, and 14c. In this manner, material layers are removed from the wafers being held and rotated by the wafer head assemblies 22a, 22b, 22c, and 22d. A rotary bearing 30 may support the head rotation unit 20 on the base 12 during a CMP process. As will be discussed below, more than one wafer head assembly may be used to polish more than one wafer on a single polishing pad/platen assembly.

Figure 2:
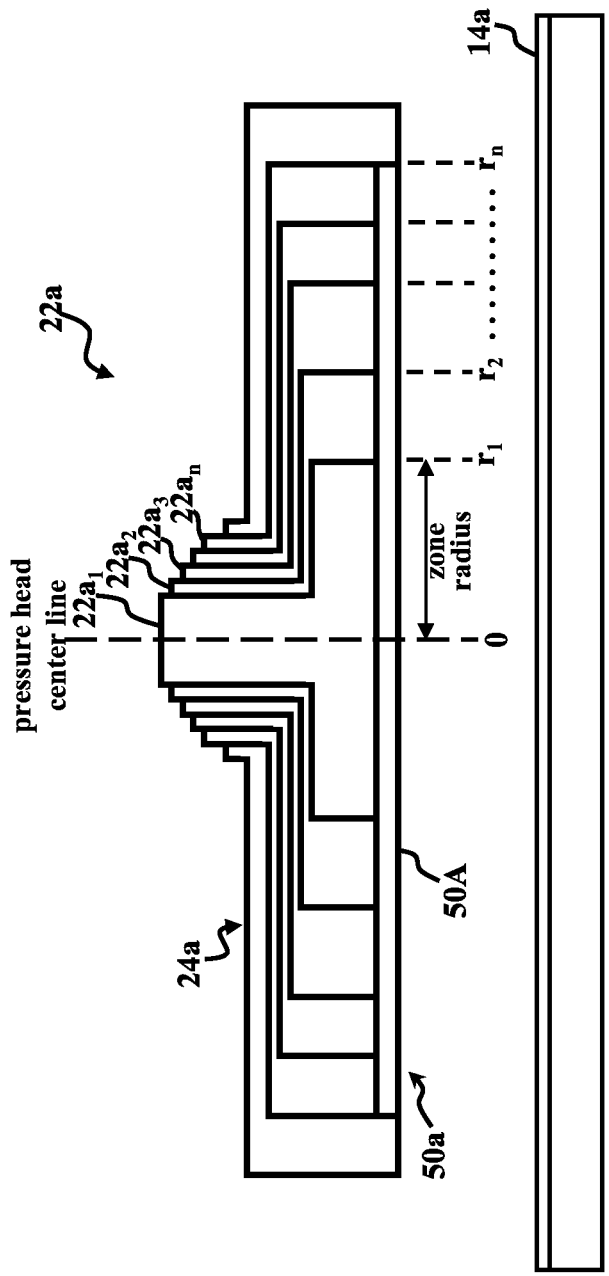
FIG. 2 is a diagrammatic sectional view of a wafer head assembly applied to a polishing pad of the CMP apparatus of FIG. 1 according to various aspects of the present disclosure.

Each wafer head assembly 22a, 22b, 22c, and 22d includes not illustrated zones associated with respective pressure chambers, such that different zones of the wafer head assemblies 22a, 22b, 22c, and 22d can exert different pressures. For example, FIG. 2 is a cross-sectional view of a wafer head assembly, such as wafer head assembly 22a, that can be implemented in CMP apparatus 10. The retention ring 24a of the wafer head assembly 22a includes a number of pressure zones $22a_1, 22a_2, 22a_3, \ldots, 22a_n$, where n is the number of zones of the wafer head assembly 22a. Each pressure zone $22a_1, 22a_2, 22a_3, \ldots, 22a_n$ has an active radius, $r_1, r_2, r_3, \ldots, r_n$, respectively. The pressure zones $22a_1, 22a_2, 22a_3, \ldots, 22a_n$ includes a pressure chamber that can exert a pressure on a wafer 50a during processing, such that a surface 50A of the wafer 50 is polished to meet thickness and surface uniformity profile targets. The pressure of each zone $22a_1, 22a_2, 22a_3, \ldots, 22a_n$ can be individually varied according to various CMP polishing recipes and/or parameters to achieve the thickness and surface uniformity profile targets for the surface 50A of the wafer 50a. In the depicted embodiment, the wafer head assembly 22a rotates with a same angular velocity throughout the pressure zones $22a_1, 22a_2, 22a_3, \ldots, 22a_n$. Further, as noted, each wafer head assembly 22a, 22b, 22c, and 22d includes zones associated with respective pressure chambers. The number of pressure zones in each wafer head assembly 22a, 22b, 22c, and 22d may be the same or different.

A head clean load/unload (HCLU) station 40 is included on the base 12. The HCLU station 40 includes a load cup 42 for loading wafers onto and unloading wafers from the wafer head assemblies 22a, 22b, 22c, and 22d. In an example, the load cup 42 can include a pedestal support column that supports a circular pedestal 44 on which the wafers are placed for loading and unloading. A pedestal film may be provided on the upper surface of the pedestal 44 for contacting the patterned surface (the surface on which IC devices are fabricated) of each wafer. Fluid openings may extend through the pedestal 44 (and pedestal film when included) so that the wafer head assemblies 22a, 22b, 22c, and 22d and the top surface of the pedestal 44 can be washed at the load cup 42 by ejecting washing fluid through the fluid openings.

In operation, the CMP apparatus 10 removes material from a layer on each wafer to reduce a thickness of the layer to a desired target thickness. Each wafer is mounted on the wafer head assemblies 22a, 22b, 22c, or 22d and polished against polishing pads of polishing pad/platen assemblies 14a, 14b, and/or 14c (in other words, subjected to a CMP process). More specifically, the wafer head assemblies 22a, 22b, 22c, and 22d exert a down force to keep their respective wafers in contact with the polishing pads of polishing pad/platen assemblies 14a, 14b, or 14c. Further, sufficient slurry flow onto the polishing pads of polishing pad/platen assemblies 14a, 14b, and/or 14c (and thus the wafer surfaces) ensures proper chemical actions between polishing grains of the polishing pads and the wafer surfaces. The polishing pads progressively remove material from and reduce the thickness of the layer on the wafer.

Figure 3:
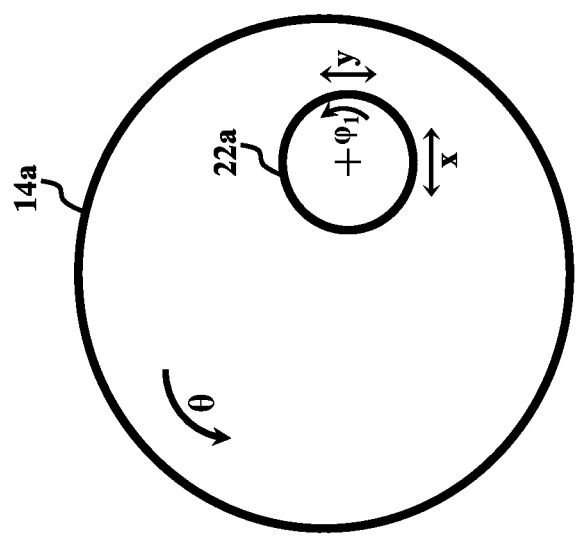
FIG. 3 is a diagrammatic top view of a wafer head assembly applied to a polishing pad of the CMP apparatus of FIG. 1 according to various aspects of the present disclosure.
Figure 4:
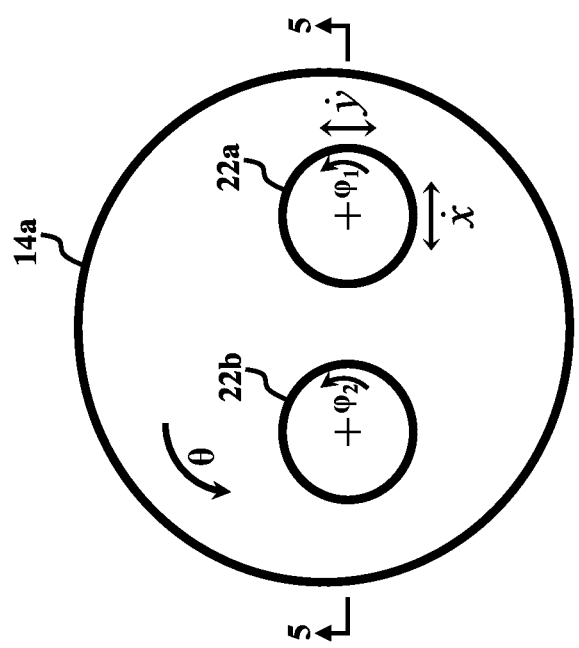
FIG. 4 is a diagrammatic top view of wafer head assemblies applied to a polishing pad of the CMP apparatus of FIG. 1 according to various aspects of the present disclosure.
Figure 5:
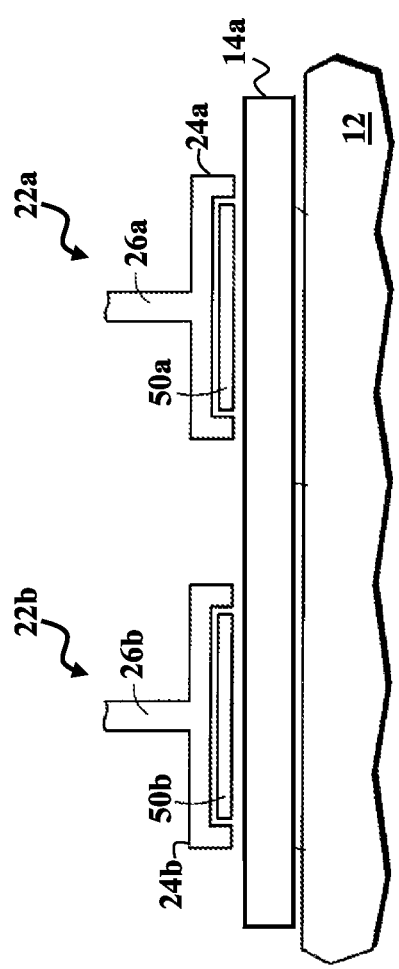
FIG. 5 is a diagrammatic cross-sectional view of the wafer head assemblies taken along line 5-5 in FIG. 4 according to various aspects of the present disclosure.

In an example, referring to FIG. 3, a single wafer head assembly, such as wafer head assembly 22a, polishes a wafer on a single polishing pad/platen assembly, such as polishing pad/platen assembly 14a. During the polishing process, the polishing pad/platen assembly 14a rotates at an angular velocity $\theta$ about an axis of the polishing pad/platen assembly 14a, and the wafer head assembly 22a rotates at an angular velocity $\varphi_1$ about an axis of the wafer head assembly 22a. In the depicted embodiment, the wafer head assembly 22a can transitionally move along an x direction and a y direction. The polishing pad/platen assembly 14a may also move linearly, in x and/or y directions. A pre-CMP profile, such as a pre-CMP thickness, of the layer is initially measured, and then, a polishing recipe is determined, for example, by an external and/or internal control system (such as an in-line metrology system), to achieve the desired target thickness of the layer. The polishing recipe can include an estimated polish time, angular velocity, linear velocity, pressure (such as mean pressure for the wafer head assembly or a pressure profile for the wafer head assembly (i.e., a pressure for each respective zone of the wafer head assembly)), other polishing parameters, or combinations thereof. The CMP apparatus then uses the polishing recipe to achieve the desired target thickness for the layer. In another example, referring to FIGS. 4 and 5, multiple wafer head assemblies, such as wafer head assemblies 22a and 22b, polish more than one wafer, 50a and 50b respectively, on a single polishing pad/platen assembly, such as polishing pad/platen assembly 14a. This can be referred to as a twin-head CMP tool. During the polishing process, the polishing pad 14a rotates at the angular velocity $\theta$ about the axis of the polishing pad/platen assembly 14a, the wafer head assembly 22a rotates at the angular velocity $\varphi_1$ about an axis of the wafer head assembly 22a, and the wafer head assembly 22b rotates at an angular velocity $\varphi_2$ about an axis of the wafer head assembly 22b. The wafer head assemblies 22a and 22b move in synchronization as they swing sideways on the pad (in other words, move linearly in the x and/or y direction). Each wafer head assembly 22a and 22b may implement a same or different polishing time and/or angular velocity. Also, a same or different pressure or pressure profile can be exerted by each wafer head assembly 22a and 22b during the polishing process. Similar to the example with reference to FIG. 3, in FIGS. 4 and 5, polishing recipes are determined for each wafer held by wafer assemblies 22a and 22b, respectively.

After the polishing sequence, the wafers may be subjected to a post-CMP cleaning. The wafers may then be subjected to in-line metrology to measure a post-CMP thickness of the polished layer. The measured post-CMP thickness of the layer on each wafer may be transmitted to the external and/or internal control system. The various pre-CMP thicknesses, post-CMP thicknesses, polishing times, polishing pressures (for example, mean pressure or zone pressures), angular velocities, linear velocities, and other polishing parameters can be used to generate CMP models for deriving CMP polishing recipes for subsequent wafers to be polished.

Figure 6:
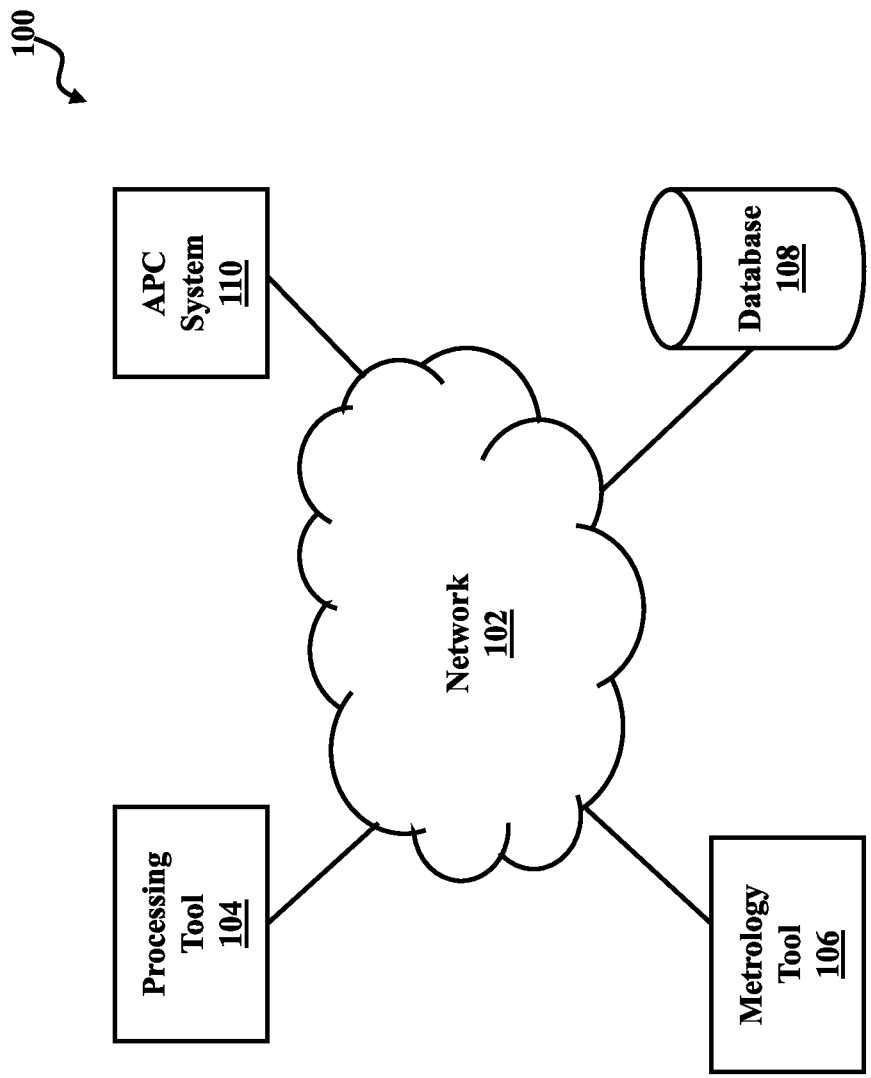
FIG. 6 is a block diagram of an integrated circuit manufacturing system according to various aspects of the present disclosure.

FIG. 6 is a block diagram of a system 100 that embodies various aspects of the present disclosure. In the depicted embodiment, the system 100 is an integrated circuit (IC) manufacturing system that implements an IC manufacturing process to fabricate IC devices. More specifically, the system 100 implements a chemical mechanical polishing (CMP) process to planarize wafers. FIG. 6 is not a comprehensive diagram of the entire system 100. Instead, for simplicity and clarity, FIG. 6 shows only selected portions of the overall system that facilitate an understanding of aspects of the present disclosure.

The system 100 includes a network 102 that enables various entities to communicate with one another. For example, each entity of the system 100 interacts with the other entities to provide services to and/or receive services from the other entities. The network 102 may be a single network or a variety of different networks, such as an intranet, an Internet, and/or other suitable network. The network 102 includes wired communication channels, wireless communication channels, or combinations thereof.

In the depicted embodiment, the various entities of the system 100 include a processing tool 104, a metrology tool 106, a database 108, and an advanced process control (APC) system 110. In the depicted embodiment, the processing tool 104 is a CMP apparatus, such as CMP apparatus 10 described above with reference to FIGS. 1-5. The system 100 may further include various other processing tools (for example, deposition tools, annealing tools, etching tools, electroplating tools, furnaces, etc.), metrology equipment, and controllers that perform other stages of integrated circuit device fabrication but are not illustrated for the sake of simplicity and clarity.

The metrology tool 106 includes any type of metrology tool known in the art, or future-developed metrology tool. The metrology tool 106 measures various characteristics of an IC device as it is being fabricated. For example, the metrology tool 106 measures wafer parameters, such as hardness, sheet resistance, reflectivity, stress, particle density, and critical dimension. In the depicted embodiment, the metrology tool 106 measures a thickness of the wafer, or a thickness of a material layer of the wafer, at various times during the wafer's fabrication. The metrology tool 106 can measure the thickness of the wafer at various locations to determine a surface (thickness) profile of the wafer. The metrology tool 106 may classify defects and features of the wafer. The metrology tool 106 includes electrical, optical, and/or analytical tools, such as microscopes (e.g., scanning electron microscopes and/or optical microscopes), microanalytical tools, line width measurement tools, mask and reticle defect tools, particle distribution tools, surface analysis tools, stress analysis tools, resistivity and contact resistance measurement tools, mobility and carrier concentration measurement tools, junction depth measurement tools, film thickness tools, gate oxide integrity test tools, C-V measurement tools, focused ion beam (FIB) tools, laser surface defect scanners, residual gas analyzers, process tool particle counters, other metrology tools, or combinations thereof.

The metrology tool 106 can send the measurement data to the database 108 for storing. For example, in the depicted embodiment, the database 108 stores measurement data related to each wafer's pre- and post-polishing characteristics, and the database 108 also stores various CMP models associated with the measurement data. Optimizations and other adjustments may be made to the process tool 104 via the network 102 based on the measurement data stored in the database 108. In an example, the measurement data may be directly provided to the APC system 110, and the APC system 110 may store the various CMP models associated with the measurement data.

The APC system 110 controls various processes within the system 100. In the depicted embodiment, the APC system 110 controls a CMP process implemented by process tool 104, particularly providing target thickness and surface profile uniformity control. For example, by evaluating surface profiles of incoming wafers, the APC system 110 determines an operation mode, and a CMP polishing recipe, for the CMP process tool 104. Aspects of the present disclosure may be implemented within the APC system 110 to analyze information either from the metrology tools 106 or the database 108 or other proper equipment in the system 100. The APC system 110 may comprise a computer that can be a conventional, commercially-available computer, or any other suitable computer hardware. The computer may be a general purpose or specific purpose computer. The hardware of the APC system 110 includes a processor and a memory. The memory stores a computer program that is executed by the processor, and that causes the computer to control process tool 104 and various other process tools. The computer is operable to perform actions including manipulating information (including manipulating information using a model), receiving information, storing information, and transferring information. In an example, the computer may include multiple computers. The computer may include equipment or code embedded in a process tool, such as, for example, the process tool 104. The computer may further include one or more user interfaces.

Figure 7:
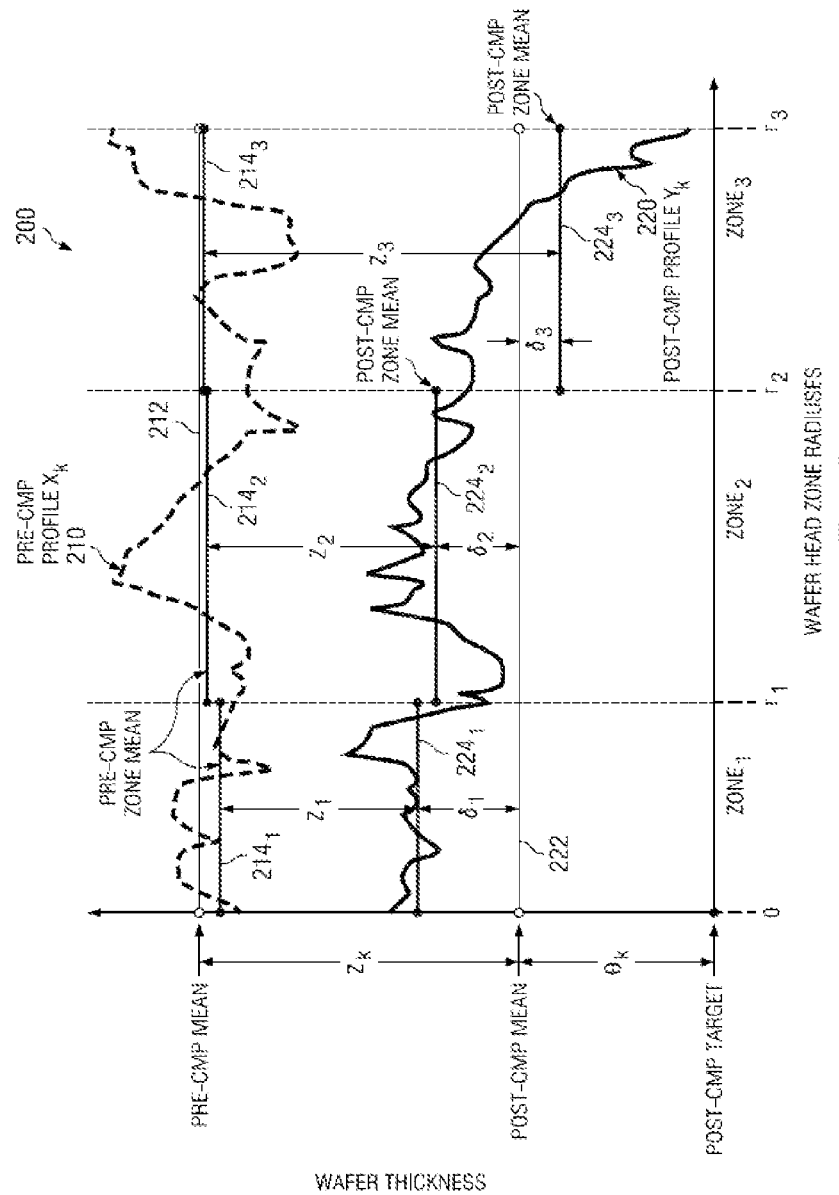
FIG. 7 is a graphical representation of measurement data that can be collected by the integrated manufacturing system of FIG. 6.

FIG. 7 is a graph 200 that can be generated by the APC system 110 of FIG. 6 using measurement data obtained from a CMP process. The graph 200 shows a curve 210 and a curve 220 that illustrate pre- and post-polishing surface profiles, respectively, of a wafer polished using a wafer head assembly k (wafer head-k) of a CMP apparatus, where k equals 1, 2, . . . , m (m being a number of wafer head assemblies used per polishing pad/platen assembly). FIG. 7 may be generated by metrology tool 106 and/or APC system 110 in the system 100 described above. Curve 210 illustrates a pre-CMP surface profile $X_k$ of the wafer, and curve 220 illustrates a post-CMP surface profile $Y_k$ of the wafer. The graph 200 includes a horizontal axis that represents a distance from a center of the wafer head-k, which is designated as zero. In the depicted embodiment, zone radiuses of the wafer head-k are indicated at various distances from the center of wafer head-k, where a radius of a wafer head zone is measured from the wafer head center (designated as zero)

to an outer perimeter of the wafer head zone. In FIG. 7, three wafer head zones are depicted—a first zone ($zone_1$) having a radius $r_1$, a second zone ($zone_2$) having a radius $r_2$, and a third zone ($zone_3$) having a radius $r_3$. The horizontal axis also represents a post-CMP target surface profile. In other words, ideally, the post-CMP target surface profile is uniform across the wafer, such as the wafer having the same thickness, from the wafer's center to the wafer's outer perimeter. The post-CMP target surface profile may be a target wafer thickness, which may refer to a thickness of the entire wafer (including all material layers of the wafer) or to a thickness of a topmost material layer of the wafer. A vertical axis of the graph 200 represents a wafer thickness. As noted, the horizontal axis represents the post-CMP target surface profile, and thus, in the depicted embodiment, the horizontal axis traverses the vertical axis at the target thickness.

Referring to curve 210, each point in the curve 210 indicates a pre-CMP wafer thickness at a respective distance from the wafer head-k center. A line 212 illustrates a pre-CMP mean wafer thickness, and lines $214_1$, $214_2$, and $214_3$ illustrate a pre-CMP mean wafer thickness for respective zones of wafer head-k—$zone_1$, $zone_2$, and $zone_3$. Portions of the curve 210 represent pre-CMP surface profiles of the wafer that correspond with each of the zones of wafer head-k. For example, $x_j$ represents a pre-CMP surface profile of the wafer corresponding with zone j of the wafer head-k, where j equals 1, 2, ..., n (n being the total number of zones of wafer head-k). In the depicted embodiment, the wafer head-k includes three zones (n=3). Accordingly, the portion of curve 210 within $zone_1$ represents $x_1$, a pre-CMP surface profile of the wafer corresponding with wafer head-k's $zone_1$; the portion of curve 210 within $zone_2$ represents $x_2$, a pre-CMP surface profile of the wafer corresponding with wafer head-k's $zone_2$; and the portion of curve 210 within $zone_3$ represents $x_3$, a pre-CMP surface profile of the wafer corresponding with wafer head-k's $zone_3$.

Referring to curve 220, each point in the curve 220 indicates a post-CMP wafer thickness at a respective distance from the wafer head-k center. A line 222 illustrates a post-CMP mean wafer thickness, and lines $224_1$, $224_2$, and $224_3$ illustrate a post-CMP mean wafer thickness for respective zones of wafer head-k—$zone_1$, $zone_2$, and $zone_3$. Portions of the curve 220 represent post-CMP surface profiles of the wafer that correspond with each of the zones of wafer head-k. For example, $y_j$ represents a post-CMP surface profile of the wafer corresponding with zone j of the wafer head-k, where j equals 1, 2, ..., n (n being the total number of zones of wafer head-k). Accordingly, since the depicted wafer head-k includes three zones, the portion of curve 220 within $zone_1$ represents $y_1$, a post-CMP surface profile of the wafer corresponding with wafer head-k's $zone_1$; the portion of curve 220 within $zone_2$ represents $y_2$, a post-CMP surface profile of the wafer corresponding with wafer head-k's $zone_2$; and the portion of curve 220 within $zone_3$ represents $y_3$, a post-CMP surface profile of the wafer corresponding with wafer head-k's $zone_3$.

From the graph 200, various polishing process characteristics may be determined from the pre- and post-CMP surface profiles of the polished wafer. For example, in the depicted embodiment, $Z_k$ represents a mean removal amount of the wafer (in other words, a difference between the pre-CMP mean wafer thickness and the post-CMP mean wafer thickness). A mean removal amount of the wafer corresponding with each wafer head-k zone, designated as $z_j$, may be determined from the graph 200 (in other words, a difference between $zone_j$'s pre-CMP mean wafer thickness and $zone_j$'s post-CMP mean wafer thickness, where j equals 1, 2, ..., n). In FIG. 7, mean removal amounts for $zone_1$, $zone_2$, and $zone_3$ are indicated by $z_1$, $z_2$, and $z_3$, respectively. $\theta_k$ represents an offset of the post-CMP mean wafer thickness from the post-CMP target thickness (in other words, a difference between the post-CMP mean wafer thickness and the post-CMP target thickness). An offset corresponding with each wafer head-k zone, designated as $\delta_j$, may be determined from the graph 200 (in other words, a difference between $zone_j$'s post-CMP mean wafer thickness and post-CMP mean wafer thickness). In FIG. 7, offsets for $zone_1$, $zone_2$, and $zone_3$ are indicated by $\delta_1$, $\delta_2$, and $\delta_3$, respectively.

The wafer and polishing characteristics depicted in graph 200 of FIG. 7 can be obtained for each wafer head assembly (1, ..., m) used in a CMP apparatus, such as CMP apparatus 10 described above with reference to FIGS. 1-5. For example, referring to FIGS. 1-2 and 4-5, the wafer and polishing characteristics for two wafer head assemblies may be obtained, where wafer head-k represents wafer head-1 and wafer head-2. As will be described below, the present disclosure uses the wafer and polishing characteristics depicted in FIG. 7 to provide target wafer thickness and surface profile uniformity control for CMP processes during IC manufacturing. For example, the wafer and polishing characteristics are evaluated to achieve one or more of four objectives. The first objective is to achieve a target wafer thickness for each wafer corresponding with each wafer head-k, where k=1, ..., m, such that any offset $\theta_k$ approaches zero ($\theta_k \rightarrow 0$). The second objective is to achieve surface profile uniformity for each zone-j of wafer head-k (where k=1, ..., m and j=1, ..., n), such that any offset $\delta_j$ approaches zero ($\delta_j \rightarrow 0$). The third objective is to achieve wafer thickness uniformity for two or more wafers polished with two or more wafer heads, such as a wafer polished with wafer head-q and a wafer polished with wafer head-r, where any offset associated with wafer head-q ($\theta_q$) and any offset associated with wafer head-r ($\theta_r$) approaches zero ($\theta_q - \theta_r \rightarrow 0$). The fourth objective is to achieve wafer thickness uniformity for two or more zones of a wafer head-k, such as zone-s and zone-t of wafer head-k, used to polish a wafer, where any offset associated with zone-s of wafer head-k ($\delta_s$) and any offset associated with zone-t of wafer head-k ($\delta_t$) approaches zero ($\delta_s - \delta_t 43\ 0$). Any one or more of these four objectives may be achieved by the evaluating wafer and polishing characteristics, such as those depicted in graph 200. The graph 200 in FIG. 7 is provided for illustration purposes only. It is understood that the wafer and polishing characteristics may be evaluated solely with data derived from processing (for example, derived from process tool 104, metrology tool 106, database 108, and/or APC system 110), without generating graphical representations of the data, such as the graph 200 in FIG. 7.

Figure 8:
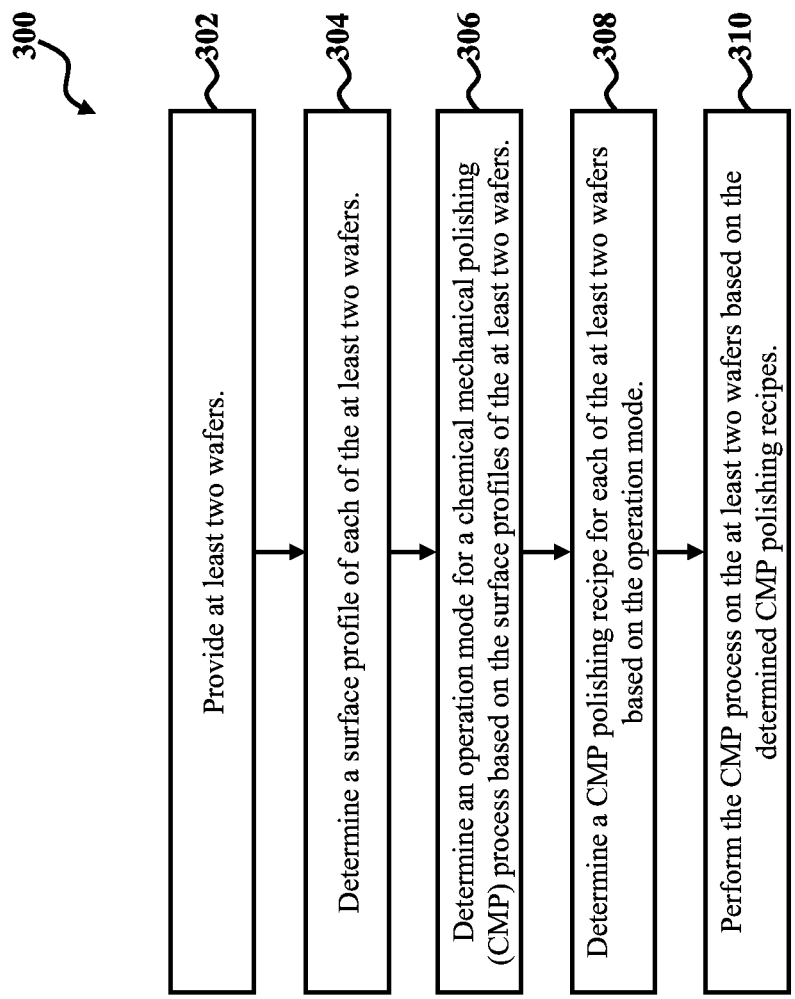
FIG. 8 is a flow chart of a method for performing a CMP process on a wafer that can be implemented by the integrated manufacturing system of FIG. 6 according to various aspects of the present disclosure.

FIG. 8 is a flow chart of a method 300 for providing target thickness and surface profile uniformity control of a multi-head CMP process according to various aspects of the present disclosure. More specifically, the method 300 uses wafer pre- and post-polishing characteristics, such as the characteristics described above with reference to FIG. 7, to determine an operation mode for the multi-head CMP process performed by a CMP apparatus, such as CMP apparatus 10 described above with reference to FIGS. 1-5. The method 300 may be implemented by the system 100, described above with reference to FIG. 6, to provide target thickness and surface profile uniformity control for polished wafers. Additional steps can be provided before, during, and after the method 300, and some of the steps described can be replaced or eliminated for other embodiments of the method.

At blocks 302 and 304, at least two wafers are provided for a CMP process, and the at least two wafers are evaluated to determine each wafer's surface profile (topological pattern). For example, referring to the system 100, the metrology tool 106 measures various characteristics of each wafer, such as density, hardness, and thickness at various locations of each wafer. From the various measured characteristics, the metrology tool 106 can determine the surface profiles of each wafer. Alternatively, the various characteristics of each wafer may be indirectly derived from software models and/or computations. The various characteristics of each wafer, and corresponding surface profiles of each wafer, can be stored in the database 108 of system 100, or stored in a database of APC system 110.

Figure 9:
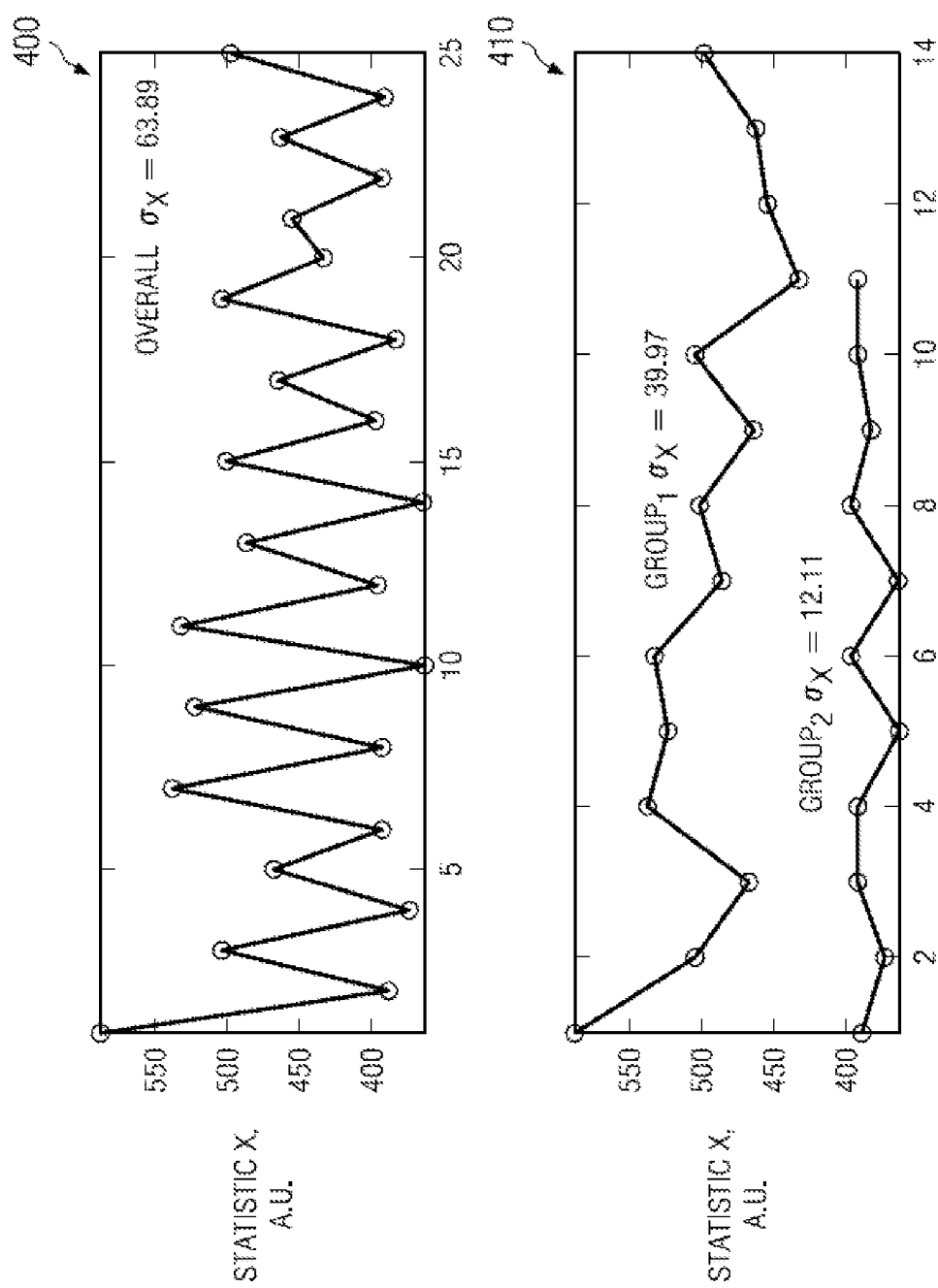
FIGS. 9-11 are graphical representations of data that can be generated by the integrated manufacturing system of FIG. 6.

The surface profiles of each wafer are evaluated and classified into a group or classification corresponding with a pre-defined surface profile pattern. In the depicted embodiment, the APC system 110 can retrieve the measurement data corresponding with the surface profiles of each wafer from the database 108. Statistics, such as means and variances, may be applied to the measurement data to classify the surface profiles into a number of groups. For example, referring to FIG. 9, a topmost graph 400 illustrates a wafer characteristic, such as a pre-CMP mean thickness in arbitrary units (a.u.), of twenty-five (25) wafers. A standard deviation of the mean thicknesses is about 63.89. The bottommost graph 410 illustrates the wafer characteristic, such as the pre-CMP mean thickness in arbitrary units, of the twenty-five wafers partitioned into two groups, such that a standard deviation of each group is smaller than the overall standard deviation. In the depicted embodiment, a standard deviation of group 1 (including fourteen (14) of the twenty-five wafers) is about 39.97, and a standard deviation of group 2 (including eleven (11) of the twenty-five wafers) is about 12.11. The surface profiles may also be classified by partitioning each wafer into zones and evaluating the surface profile corresponding with each zone. The zones may be defined by various zone boundaries, such as by geometric dimensions of the pressure zones of the wafer heads. Other classification methodologies may additionally or alternatively be implemented, apart from the statistical method, described herein. Classifying the at least two wafers into the pre-defined surface profile patterns balances increasing loadings on logistics of the system (by reducing incoming surface profile patterns), such as system 100, with achieving accurate and closely controlled target thickness and surface profile uniformity control of each wafer polished. Accordingly, the classification methodology and classification parameters may be defined on a case-by-case basis.

Based on the surface profile classifications, various CMP models are generated that correspond with the surface profile classifications. For example, where more than one wafer head assembly is being used to polish more than one wafer on a single polishing pad, a model for achieving a mean target thickness for each of the wafers may be provided by Equation (1) below. Equation (1) provides a mean target wafer thickness model for operating m wafer heads (or wafer head assemblies), where m is the number of wafer heads used for polishing per polishing pad.

$$\begin{bmatrix} Z_k \\ \vdots \\ Z_m \end{bmatrix} = \begin{bmatrix} a_{ij} & \cdots & a_{1m} & a_{k0} \\ \vdots & \ddots & \vdots & \vdots \\ a_{m1} & \cdots & a_{mm} & a_{m0} \end{bmatrix} \cdot \begin{bmatrix} P_k \\ \vdots \\ P_m \\ t \end{bmatrix} + \begin{bmatrix} b_k \\ \vdots \\ b_m \end{bmatrix} \quad (1)$$

For purposes of Equation (1), wafer head-k represents a wafer head assembly used for polishing a wafer-i on a polishing pad, where k and i correspondingly equal 1, 2, . . . , m (m being a number of wafer head assemblies used per polishing pad, and thus, the number of wafers polished per pad). In the depicted embodiment, $Z_k$ is a mean thickness removal amount of the wafer-i polished using wafer head-k (where i=k and k=1, . . . , m), $P_k$ is a mean pressure exerted by wafer head-k while polishing its corresponding wafer-i (where i=k and k=1, . . . , m), t is polishing time for all the wafer heads, $a_{ij}$ is a removal rate of wafer-i per unit change of pressure of wafer head-k (where i=k and k=1, . . . , m), $a_{k0}$ is a removal rate of wafer-i polished using wafer head-k per unit change of polishing time (where i=k and k=1, . . . , m), and $b_k$ is a removal target offset of wafer-i polished using wafer head-k (where i=k and k=1, . . . , m). Accordingly, Equation (1) observes mean thicknesses of each wafer corresponding with a wafer head, and $a_{ij}$ accounts for interactions among wafer head-k and other wafer heads used for polishing. Various methods, such as a least square regression, may be used to determine (calculate) numerical values of the matrices of Equation (1) from actual measurements (for example, measurement data derived from pre- and post-CMP polishing characteristics of previously polished wafers), such that a target mean thickness removal amount (Z) can be determined. For example, by applying a linear, least squares regression to the measurement data, Equation (2) provided below determines various CMP model parameters that can be used to determine various CMP parameters for a CMP polishing recipe to achieve the mean target thickness removal amount Z:

$$Z = A \cdot P + A_0 \cdot t + B \quad (2)$$

where P is a mean pressure vector including mean pressures for each polishing wafer head; t is a polishing time that achieves the mean thickness removal amount, Z; and matrix A, vector $A_0$, and vector B are coefficients/parameters determined by the least square regression, or other methodology (such as a quadratic regression).

In another example, where more than one wafer head assembly is being used to polish more than one wafer on a single polishing pad, a model for achieving surface profile uniformity for each of the wafers may be provided by Equation (3) below. Equation (3) provides a surface profile uniformity model for a single wafer head, and it can be used to determine processing parameters for each wafer head.

$$\begin{bmatrix} \delta z_j \\ \vdots \\ \delta z_{l-1} \\ \delta z_{l+1} \\ \vdots \\ \delta z_n \end{bmatrix} = \begin{bmatrix} c_{j,*} & \cdots & c_{1,l-1} & c_{1,l+1} & \cdots & c_{1,n} \\ \vdots & \ddots & \vdots & \vdots & \ddots & \vdots \\ c_{l-1,1} & \cdots & c_{l-1,l-1} & c_{l-1,l+1} & \cdots & c_{l-1,n} \\ c_{l+1,l} & \cdots & c_{l+1,l-1} & c_{l+1,l+1} & \cdots & c_{l+1,n} \\ \vdots & \ddots & \vdots & \vdots & \ddots & \vdots \\ c_{n,1} & \cdots & c_{n,l-1} & c_{n,l+1} & \cdots & c_{l+1,n} \end{bmatrix} \cdot \begin{bmatrix} \delta p_j \\ \vdots \\ \delta p_{l-1} \\ \delta p_{l+1} \\ \vdots \\ \delta p_n \end{bmatrix} + \begin{bmatrix} d_j \\ \vdots \\ d_{l-1} \\ d_{l+1} \\ \vdots \\ d_n \end{bmatrix} \quad (3)$$

For purposes of Equation (3), wafer head-k represents a wafer head assembly used for polishing a wafer-i on a polishing pad, where k and i correspondingly equal 1, 2, ..., m (m being a number of wafer head assemblies used per polishing pad, and thus, the number of wafers polished per pad). Each zone of wafer head-k is represented by zone-j, where j=1, ..., n (n being a number of zones per wafer-head). References to zone-l represent another zone of wafer head-k that is not zone-j, and thus, j≠l. More specifically, zone-l is an arbitrary zone chosen as a reference datum, such that all other zone thicknesses are measured with respect to this reference datum. This reference datum may also include the mean thicknesses of all the zones. In the depicted embodiment, $\delta z_j$ is a mean thickness removal amount of the wafer-i in zone-j of wafer head-k with respect to zone-l of wafer head-k (where i=k, j≠l, and j=1, ..., n). In other words, $\delta z_j$ indicates a difference between the mean thickness removal amount of wafer-i in zone-j and the mean thickness removal amount of wafer-i in zone-l. $c_{j,*}$ accounts for interaction effects between zones, representing a difference in differential rates of removal of wafer-i in zone-j and zone-*, both with respect to zone-l. $\delta p_j$ is a pressure differential of zone-j with respect to zone-l (where j≠l and j=1, ..., n), and $d_j$ is a differential removal target offset of zone-j with respect to zone-l (where j≠l and j=1, ..., n). In other words, $\delta p_j$ evaluates a difference between the pressures exerted on the wafer-i by zone-j and zone-l, and $d_j$ evaluates a difference between removal target offsets of wafer-i in zone-j and zone-l. Various methods, such as a least square regression, may be used to determine (calculate) numerical values of the matrices of Equation (3) from actual measurements (for example, measurement data derived from pre- and post-CMP polishing characteristics of previously polished wafers). For example, by applying a linear, least squares regression to the measurement data, an equation may be derived that defines various CMP model parameters that can be used to determine various CMP parameters for a CMP polishing recipe to achieve surface profile uniformity.

In another example, where more than one wafer head assembly is used to polish more than one wafer on a single polishing pad, a model for achieving target thickness and surface profile uniformity for each of the wafers may be provided by Equation (4) below. Equation (4) provides a target thickness and surface profile uniformity model for a single wafer head, and it can be used to determine processing parameters for each wafer head.

$$\begin{bmatrix} z_j \\ \vdots \\ z_n \end{bmatrix} = \begin{bmatrix} a_{j^*} & \cdots & a_{1n} & a_{j0} \\ \vdots & \ddots & \vdots & \vdots \\ a_{n1} & \cdots & a_{nn} & a_{n0} \end{bmatrix} \cdot \begin{bmatrix} p_j \\ \vdots \\ p_n \\ t \end{bmatrix} + \begin{bmatrix} b_j \\ \vdots \\ b_n \end{bmatrix} \quad (4)$$

For purposes of Equation (4), wafer head-k represents a wafer head assembly used for polishing a wafer-i on a polishing pad, where k and i correspondingly equal 1, 2, ..., m (m being a number of wafer head assemblies used per polishing pad, and thus, the number of wafers polished per pad). Each zone of wafer head-k is represented by zone-j, where j=1, ..., n (n being a number of zones per wafer-head). In the depicted embodiment, $z_j$ is a mean thickness removal amount of the wafer-i in zone-j of wafer head-k (where i=k and j=1, ..., n); $p_j$ is a pressure exerted by zone-j of wafer head-k while polishing corresponding wafer-i (where i=k and j=1, ..., n); t is polishing time for each zone of wafer head-k; $a_{j^*}$ accounts for interaction effects between zones, representing a removal rate of wafer-i in zone-j per unit change of pressure in zone-* of wafer head-k (where zone-* is another zone of wafer head-k); $a_{j0}$ is a removal rate in zone-j of wafer head-k per unit change of polishing time (where j=1, ..., n), and $b_j$ is a removal target offset in zone-j of wafer head-k (where j=1, ..., n). It is noted that Equation (1) above deals with thicknesses of all the wafers corresponding with the various wafer heads, therefore focusing on interactions between the different wafer heads, whereas Equation (4) deals with thicknesses across zones of a wafer corresponding with various zones of a particular wafer head, therefore focusing on interactions between the various zones of the particular wafer head.

Various methods, such as a least square regression, may be used to determine (calculate) numerical values of the matrices of Equation (4) from actual measurements (for example, measurement data derived from pre- and post-CMP polishing characteristics of previously polished wafers), such that a target mean thickness removal amount (z) of each zone can be determined. For example, by applying a linear, least squares regression to the measurement data, Equation (5) provided below determines various CMP model parameters that can be used to determine various CMP parameters for a CMP polishing recipe to achieve the mean target thickness removal amount (z) of each zone:

$$z = A \cdot p + A_0 \cdot t + B \quad (5)$$

where p is a pressure vector including pressures for each zone of the wafer head; t is a polishing time that achieves the mean thickness removal amount, z, of each zone; and matrix A, vector $A_0$, and vector B are coefficients/parameters determined by the least square regression, or other methodology (such as a quadratic regression). It is noted that values of matrix A, vector $A_0$, and vector B in Equation (2) and Equation (5) may be different, and thus, need not necessarily be the same. In an example, where a wafer head has five (5) zone pressures and zone 5 is used as the reference zone, based on measurement data, CMP models consistent with Equation (4), provide:

$$\begin{bmatrix} z_1 \\ z_2 \\ z_3 \\ z_4 \end{bmatrix} = \begin{bmatrix} 29.87 & -13.53 & 95.39 & 16.41 & 276.53 & 10.51 \\ 26.33 & -82.94 & 34.74 & 464.23 & 23.37 & 11.75 \\ -17.51 & 8.53 & 383.09 & 103.89 & 18.99 & 11.54 \\ 147.19 & 170.35 & 98.84 & -19.36 & 23.51 & 11.60 \end{bmatrix} \cdot \begin{bmatrix} p_1 \\ p_2 \\ p_3 \\ p_4 \\ p_5 \\ t \end{bmatrix} + \begin{bmatrix} -834.89 \\ -661.31 \\ -645.47 \\ -571.53 \end{bmatrix} \quad (6)$$

The CMP model may be normalized, thereby providing the following:

$$\begin{bmatrix} z_1 \\ z_2 \\ z_3 \\ z_4 \end{bmatrix} = \begin{bmatrix} 0.0396 & -0.0186 & 0.1265 & 0.0231 & 0.8558 & 0.6311 \\ 0.0387 & -0.1267 & 0.0511 & 0.7251 & 0.0802 & 0.7822 \\ -0.0228 & 0.0116 & 0.4991 & 0.1438 & 0.0577 & 0.6808 \\ 0.2617 & 0.3147 & 0.1757 & -0.0366 & 0.0975 & 0.9341 \end{bmatrix}. \quad (7)$$

$$\begin{bmatrix} p_1 \\ p_2 \\ p_3 \\ p_4 \\ p_5 \\ t \end{bmatrix} + \begin{bmatrix} 0.0000 \\ 0.0000 \\ 0.0000 \\ 0.0000 \end{bmatrix}$$

Figure 10:
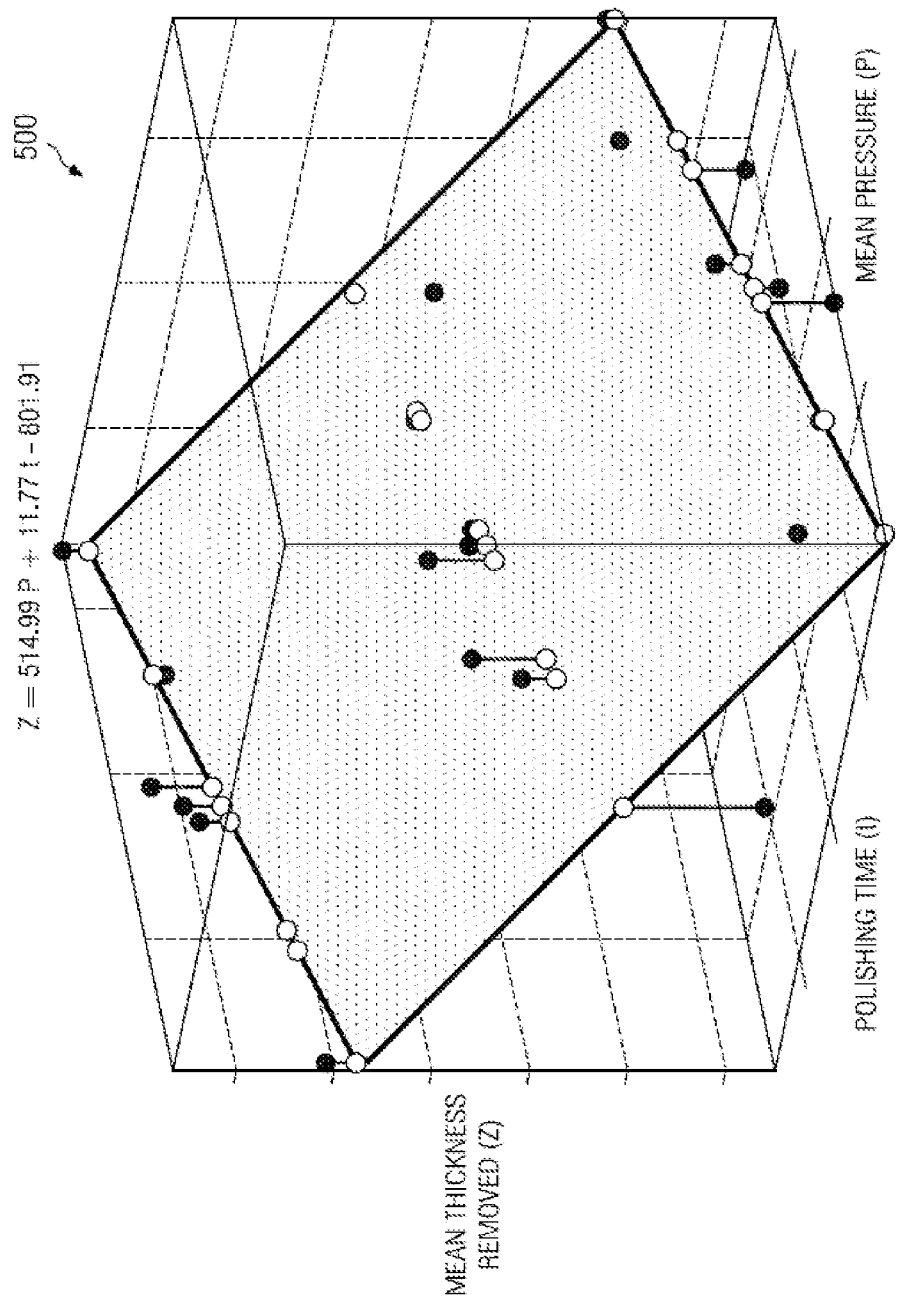

FIG. 10 provides a graphical depiction of a model surface 500 derived from a CMP model generated applying measurement data to Equation (1) above. In the graphical depiction, one axis represents polishing time (t), one axis represents mean pressure (P) exerted by a wafer-head, and one axis represents mean thickness removed (Z). The polishing time, mean pressure, and mean thickness removed are depicted in arbitrary units. In the depicted embodiment, a least squares regression is applied to the CMP model depicted in FIG. 10 to derive parameters for Equation (2), provided above, where:

$$Z = 514.99 \cdot P + 11.77 \cdot t - 801.91 \qquad (8)$$

where the parameters A, $A_0$, and B are respectively 514.99, 11.77, and −801.91, which in the depicted embodiment, absorbs interaction effects from other wafer heads. Other CMP models may also be generated, other than those described herein. Each of the CMP models is generated based on the classified surface profile patterns of the at least two wafers, such that each CMP model identifies model parameters for achieving target thickness and/or surface profile uniformity.

At block 306, an operation mode for a CMP process is determined based on the surface profiles of the at least two wafers. More specifically, based on the classified surface profiles, the operation mode is designated as a coupled mode (multiple wafer processing), where the at least two wafers are polished on a single polishing pad/platen assembly, or decoupled mode (single wafer processing), where each of the at least two wafers is polished on a different polishing pad/platen assembly. In the coupled mode, the mode of operation may aim to achieve target thickness control, where the CMP polishing recipes of the wafer-heads are set to achieve a target removal thickness of each of the wafers; surface profile uniformity control, where the CMP polishing recipes of the wafer-heads are set to achieve a surface profile uniformity of each of the wafers; sequential target thickness and surface profile uniformity control, where a first CMP polishing recipe associated with a first polish achieves a target thickness and a second CMP polishing recipe associated with the a second polish achieves a surface profile uniformity, or vice versa; concurrent target thickness and surface profile uniformity, where the CMP polishing recipe concurrently achieves target removal thickness and surface profile uniformity; or combinations thereof (for example, achieve target thickness removal control for selected wafer(s) and sequential target thickness removal and surface uniformity profile control for other selected wafer(s), or achieve target thickness removal control for selected wafer(s) and concurrent target thickness removal and surface uniformity profile control for other selected wafer(s)). In a similar manner, in the decoupled mode, the mode of operation may aim to achieve target thickness removal control; surface profile uniformity control; sequential target thickness and surface profile uniformity control; concurrent target thickness and surface profile uniformity; or combinations thereof Based on the classified surface profiles and the operation mode, an appropriate CMP model is selected from the generated CMP models, described above, such that target thickness and/or surface profile uniformity control may be achieved for the at least two wafers. The operation mode may indicate that whether a polishing time, a pressure parameter (for example, mean pressure and/or pressure profile), or combination thereof. The operation mode may also indicate whether a coupled or decoupled computation will be applied to the CMP model selected, in other words, whether the pressure parameter and polishing time will be determined concurrently (pressure and time coupled) or separately (pressure and time decoupled).

At block 308, a CMP polishing recipe is determined for each of the at least two wafers based on the operation mode. Various constraints may be applied to the CMP models when determining the CMP polishing recipes. In an example, where the coupled mode for achieving target thickness control is selected for multiple-wafer processing, and the CMP model associated with Equation (1) above is selected, the CMP model determines mean pressure (P=$[P_k, \ldots, P_m]^T$, where k=1, . . . , m and T represents a transpose operation of the row-vector into a column-vector) and polishing time (t) for each of the wafer heads used to polish the wafers on a single polishing pad/platen assembly. More specifically, Equation (9), provided below, is used to determine the mean pressures, P, and polishing time for the wafer heads.

$$[A \quad A_O] \cdot \begin{bmatrix} P \\ t \end{bmatrix} = Z_T - \hat{B} \qquad (9)$$

A and $A_0$ are derived from the CMP model described above (selected based on the classified surface profiles of the at least two wafers), $Z_T$ is the desired target thickness to be removed from each wafer, and B is an estimate of the target thickness offset of each wafer head (in other words, a comparison of the desired target thicknesses to be removed in past polishing processes to the actual thicknesses removed in the polishing processes). The mean pressures may be constrained by specifying a minimum pressure and a maximum pressure allowed for the CMP polishing process, thus, $P_{k,min} \leq P_k \leq P_{k,max}$. The polishing time may also be constrained by specifying a minimum time and a maximum time allowed for the CMP polishing process, thus, $t_{min} \leq t \leq t_{max}$. From Equation (9), a CMP polishing recipe that specifies a mean pressure for each wafer head and a polishing time for each wafer head may be determined to achieve a mean thickness removal for multiple-wafer processing.

In another example, where the decoupled mode for achieving target thickness and surface profile uniformity control is selected for single-wafer processing, and the CMP model associated with Equation (4) above is selected, the CMP model determines pressures for each zone of a wafer head (p=$[p_j, \ldots, p_n]^T$, where j=1, . . . , n and T represents a transpose operation of the row-vector into a column-vector) and polishing time (t) for each of the wafer heads used to polish the wafers. More specifically, Equation (10), provided below, is used to determine the zone pressures, p, and polishing time, t, for each wafer head.

$$[A \quad A_O] \cdot \begin{bmatrix} p \\ t \end{bmatrix} = z_T - \hat{b} \qquad (10)$$

A and $A_0$ are derived from the CMP model described above (selected based on the classified surface profiles of the at least two wafers), $z_T$ is the desired target thickness to be removed from each zone, and b is an estimate of the target thickness offset of each zone (in other words, a comparison of the desired target thicknesses to be removed in past polishing processes to the actual thicknesses removed in the polishing processes). The zone pressures may be constrained by specifying a minimum pressure and a maximum pressure allowed for the zones during the CMP polishing process, thus, $p_{j,min} \le p_j \le p_{j,max}$. The polishing time may also be constrained by specifying a minimum time and a maximum time allowed for the CMP polishing process, thus, $t_{min} \le t \le t_{max}$. From Equation (10), a CMP polishing recipe that specifies zone pressures for each zone of a wafer head (in other words, a pressure profile for the wafer head) and a polishing time for each wafer head may be determined to achieve a target thickness removal amount and surface profile uniformity amount for each zone of a wafer head.

In yet another example, where the coupled mode for achieving target thickness control is selected for multiple-wafer processing, the CMP model associated with Equation (1) above is selected, and the decoupled computation mode is selected (in other words, a pressure parameter will be determined separately from polishing time), the CMP model determines mean pressure ($P=[P_k, \ldots, P_m]^T$, where $k=1, \ldots, m$ and T represents a transpose operation of the row-vector into a column-vector) for each of the wafer heads used to polish the wafers on a single polishing pad/platen assembly. More specifically, Equation (11), provided below, is used to determine the mean pressures, P, for the wafer heads.

$$P = A^{-1} \cdot (Z_T - \hat{B} - A_0 \cdot t_0) \quad (11)$$

Matrix A and vector $A_0$ are derived from the CMP model described above (selected based on the classified surface profiles of the at least two wafers), $Z_T$ is the desired target thickness to be removed from each wafer, and $\hat{B}$ is an estimate of the target thickness offset of each wafer head (in other words, a comparison of the desired target thicknesses to be removed in past polishing processes to the actual thicknesses removed in the polishing processes). The polishing time is constrained by defining the polishing time as $t_0$, which is defined from a standard CMP polishing recipe, or other rule-based override. From Equation (11), a CMP polishing recipe that specifies a mean pressure for each wafer head may be determined to achieve a mean thickness removal for multiple-wafer processing. The polishing time, which has been defined as $t_0$, may need compensation. For example, $s_P$ measures any offset between target mean pressures and mean pressures calculated by Equation (11) using initial condition $t_0$. Accordingly, if $s_P \ne 0$, then a post-compensation adjustment to $t_0$ is needed, such that $s_P$ is a minimum ($s_P \to \min\{s_P(t_0)\}$) and $s_P$ is determined by Equation (12), provided below:

$$s_P = \Sigma_{k=1}^m (P_k - \bar{P}) \quad (12)$$

where $\bar{P}$ is an average of all mean pressures for the wafer heads. The mean pressures may be constrained by specifying a minimum pressure and a maximum pressure allowed for the CMP polishing process, thus, $P_{k,min} \le P_k \le P_{k,max}$. The polishing time may also be constrained by specifying a minimum time and a maximum time allowed for the CMP polishing process, thus, $t_{min} \le t_0 \le t_{max}$.

In yet another example, where the decoupled mode for achieving target thickness and surface profile uniformity control is selected for single-wafer processing, the CMP model associated with Equation (4) above is selected, and the decoupled computation mode is selected, the CMP model determines pressures for each zone of a wafer head ($p=[p_j, \ldots, p_n]^T$, where $j=1, \ldots, n$ and T represents a transpose operation of the row-vector into a column-vector). More specifically, Equation (13), provided below, is used to determine the zone pressures, p, for each wafer head.

$$p = A^{-1} \cdot (z_T - \hat{b} - A_0 \cdot t_0) \quad (13)$$

Matrix A and vector $A_0$ are derived from the CMP model described above (selected based on the classified surface profiles of the at least two wafers), $z_T$ is the desired target thickness to be removed from each zone, and $\hat{b}$ is an estimate of the target thickness offset of each zone (in other words, a comparison of the desired target thicknesses to be removed in past polishing processes to the actual thicknesses removed in the polishing processes). The polishing time is constrained by defining the polishing time as $t_0$, which is defined from a standard CMP polishing recipe, or other rule-based override. From Equation (13), a CMP polishing recipe that specifies zone pressures for each zone of a wafer head (in other words, a pressure profile for the wafer head) may be determined to achieve a target thickness removal amount and surface profile uniformity for each zone of a wafer head. The polishing time, which has been defined as $t_0$, may need compensation. For example, $s_p$ measures any offset between target zone pressures and zone pressures calculated by Equation (13) using initial condition $t_0$. Accordingly, if $s_p \ne 0$, then a post-compensation adjustment to $t_0$ is needed, such that $s_p$ is a minimum ($s_p \to \min\{s_p(t_0)\}$) and $s_p$ is determined by Equation (14), provided below:

$$s_p = \Sigma_{j=1}^n (p_n - \bar{p}) \quad (14)$$

where $\bar{p}$ is an average of all zone pressures for a wafer head. The zone pressures may be constrained by specifying a minimum pressure and a maximum pressure allowed for the zones during the CMP polishing process, thus, $p_{j,min} \le p_j \le p_{j,max}$. The polishing time may also be constrained by specifying a minimum time and a maximum time allowed for the CMP polishing process, thus, $t_{min} \le t_0 \le t_{max}$.

In yet another example, (1) where the coupled mode for achieving surface profile uniformity control is selected for multiple-wafer processing, the CMP model associated with Equation (3) above is selected, and the decoupled computation mode is selected (in other words, a pressure parameter will be determined separately from polishing time), or (2) where the decoupled mode for achieving surface profile uniformity control is selected for single-wafer processing, the CMP model associated with Equation (3) is selected, and the decoupled computation mode is selected, the CMP model determines pressures for each zone of each wafer head ($p=[p_j, \ldots, p_n]^T$, where $j=1, \ldots, n$ and T represents a transpose operation of the row-vector into a column-vector). More specifically, Equation (15), provided below, is used to determine the zone pressures, p, for each wafer head.

$$\delta p = C^{-1} \cdot (\delta \delta_T - \hat{d}) \quad (15)$$

In Equation (15), $\delta p = [\delta p_j, \ldots, \delta p_n]_k^T$ (where $j=1, \ldots, n$ and T represents a transpose operation of the row-vector into a column-vector) for each wafer head-k, where $k=1, \ldots, m$. Matrix C is derived from the CMP model described above (selected based on the classified surface profiles of the at least two wafers), $\delta z_T$ is the desired surface uniformity profile to be removed from each zone, and $\hat{d}$ is an estimate of differential surface profile uniformity offsets of each zone. Also, the polishing time can be constrained by defining the polishing time as $t_0$, which is defined from a standard CMP polishing recipe, or other rule-based override. From Equation (15), a CMP polishing recipe that specifies zone pressures for each zone of a wafer head (in other words, a pressure profile for the wafer head) may be determined to achieve a surface profile uniformity for each zone of a wafer head.

Figure 11:
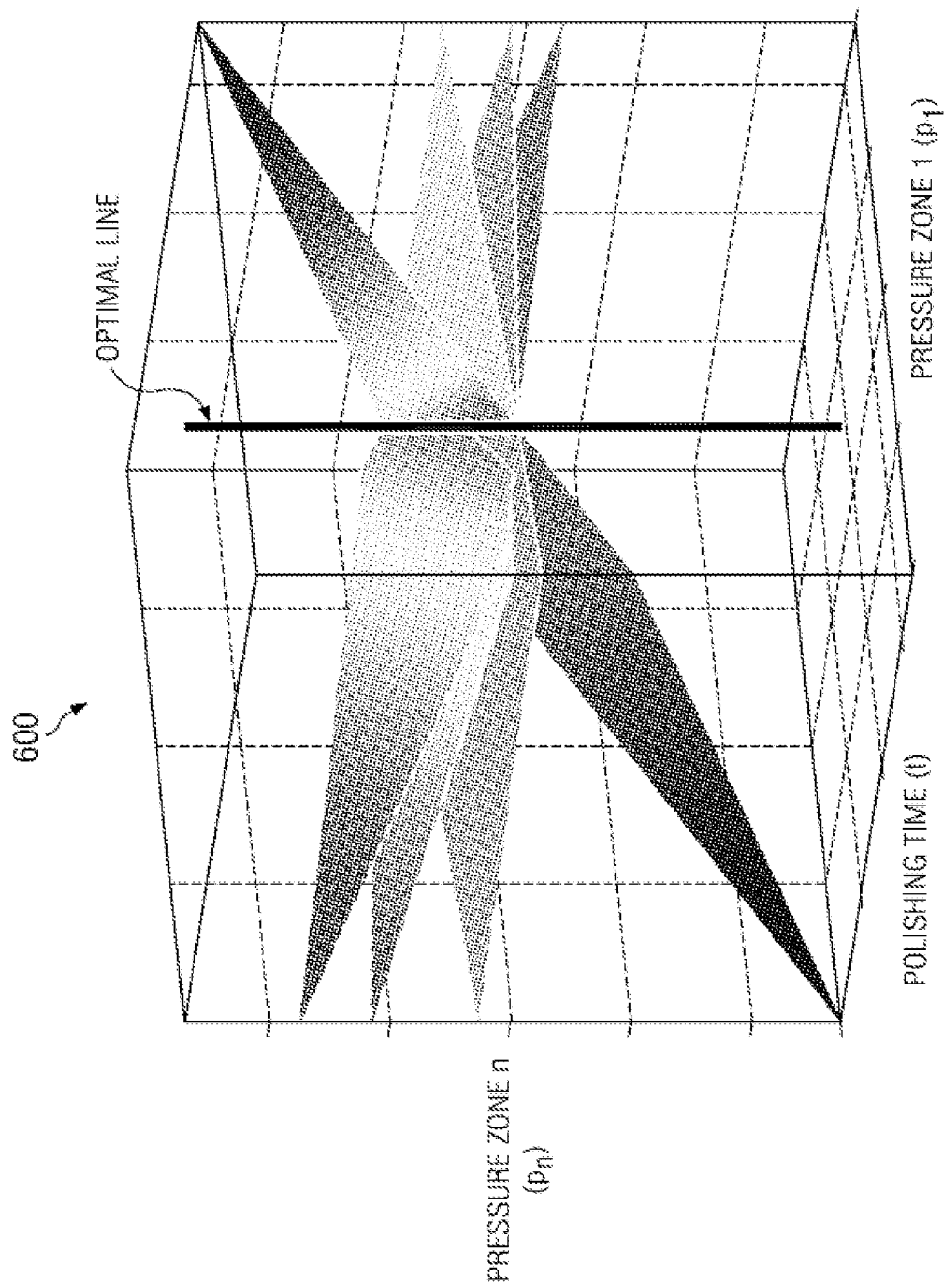

An additional pressure balancing constraint may be applied to the CMP models. For example, whether the coupled computation or decoupled computation is selected for determining mean pressures for multi-wafer processing, the pressure balancing constraint may specify a pressure range between a maximum and minimum pressure that is a minimum. More specifically, as a basic safeguard measure, the mean pressures of each wafer head are confined to a predefined range, thereby confining possible variations of the mean pressure of each wafer head. As another safeguard, a difference ($R_p$) among mean pressures of the wafer heads is confined to a similarly predefined range, thereby avoiding too much imbalance in the exerted force over the polishing pad/platen surface. Accordingly, the pressure balancing constraint may be similar to Equation (16), provided below.

$$R_P = \max(P_k, \ldots, P_m) - \min(P_k, \ldots, P_m) \quad (16)$$

where $R_{min} \leq R_{P,min} \leq R_{,max}$ and $k=1, \ldots, m$. Similarly, whether the coupled computation or decoupled computation is selected for determining zone pressures for single-wafer processing, the pressure balancing constraint may specify a zone pressure range between a maximum and minimum pressure that is a minimum. More specifically, as a basic safeguard measure, the zone pressures of each wafer head are confined to a predefined range, thereby confining possible variations of the zone pressures of each wafer head. As another safeguard, a difference ($r_p$) among zone pressures of the wafer head is confined to a similarly predefined range, thereby avoiding too much imbalance in the exerted force over the polishing pad/platen surface. Accordingly, the pressure balancing constraint may be similar to Equation (17), provided below.

$$r_p = \max(p_j, \ldots, p_n) - \min(P_j, \ldots, P_n) \quad (17)$$

where $r_{min} \leq r_{P,min} \leq r_{,max}$ and $j=1, \ldots, n$. FIG. 11 provides a graphical illustration 600 of feasible combinations of polishing time and pressures after various constraints have been applied to a CMP model to achieve optimal pressure balancing among zones of a wafer head. In the graphical illustration 600, an axis represents polishing time (t) in arbitrary units, an axis represents pressure of zone 1 ($p_1$), and an axis represents pressure of zone-j ($p_j$) where $j=2, \ldots, n$ (n being the number of pressure zones of the wafer head). In an example, the minimum pressure ($r_{min}$) is set as the optimal line found through each solution plane in graphical illustration 600.

At block 310, a CMP process is then performed on the at least two wafers based on the determined CMP polishing recipes. The CMP polishing recipes may indicate a pressure parameter (mean pressure and/or pressure profile of each wafer head associated with the at least two wafers), a polishing time, other suitable polishing parameter, or combinations thereof. In the depicted embodiment, the APC system 110 can relay the CMP profile recipes to the process tool 104, such that the at least two wafers are polished according to the determined CMP profile recipes. In an example, characteristics of the polished wafers (post-CMP characteristics), such as surface profiles of the at least two polished wafers, can be measured, for example by the metrology tool 106, or indirectly from software computations. The post-CMP characteristics may be stored in the database 108. The APC system 110 may modify the CMP control models based on the post-CMP characteristics of the at least two polished wafers, and/or other CMP models may be generated based on the post-CMP characteristics of the at least two polished wafers. The modified CMP and/or additional CMP models may be used for subsequent wafer processing (CMP processing).

The present disclosure provides advance process control of each wafer head in a multi-head CMP apparatus, either individually, or as a whole. The control system implements multiple operation modes, allowing concurrently control of both target thickness and surface profile uniformity, thereby improving throughput. For example, the control system may choose to control pressure parameters, polishing parameters, other suitable parameters, or combinations thereof depending on a surface profile of a wafer to be polished. In an example, the control system separates pressure profiles from polishing time. The multiple operation modes are implemented in a CMP apparatus that can polish multiple wafers on a single polishing pad/platen assembly. The disclosed control system can implement both model-based actions and rule-based overrides (in other words, apply various constraints). The control system may set zone pressures and/or angular velocities for each wafer head separately or as a group. The control system may set zone pressures according to desired surface profiles.

Figure 12:
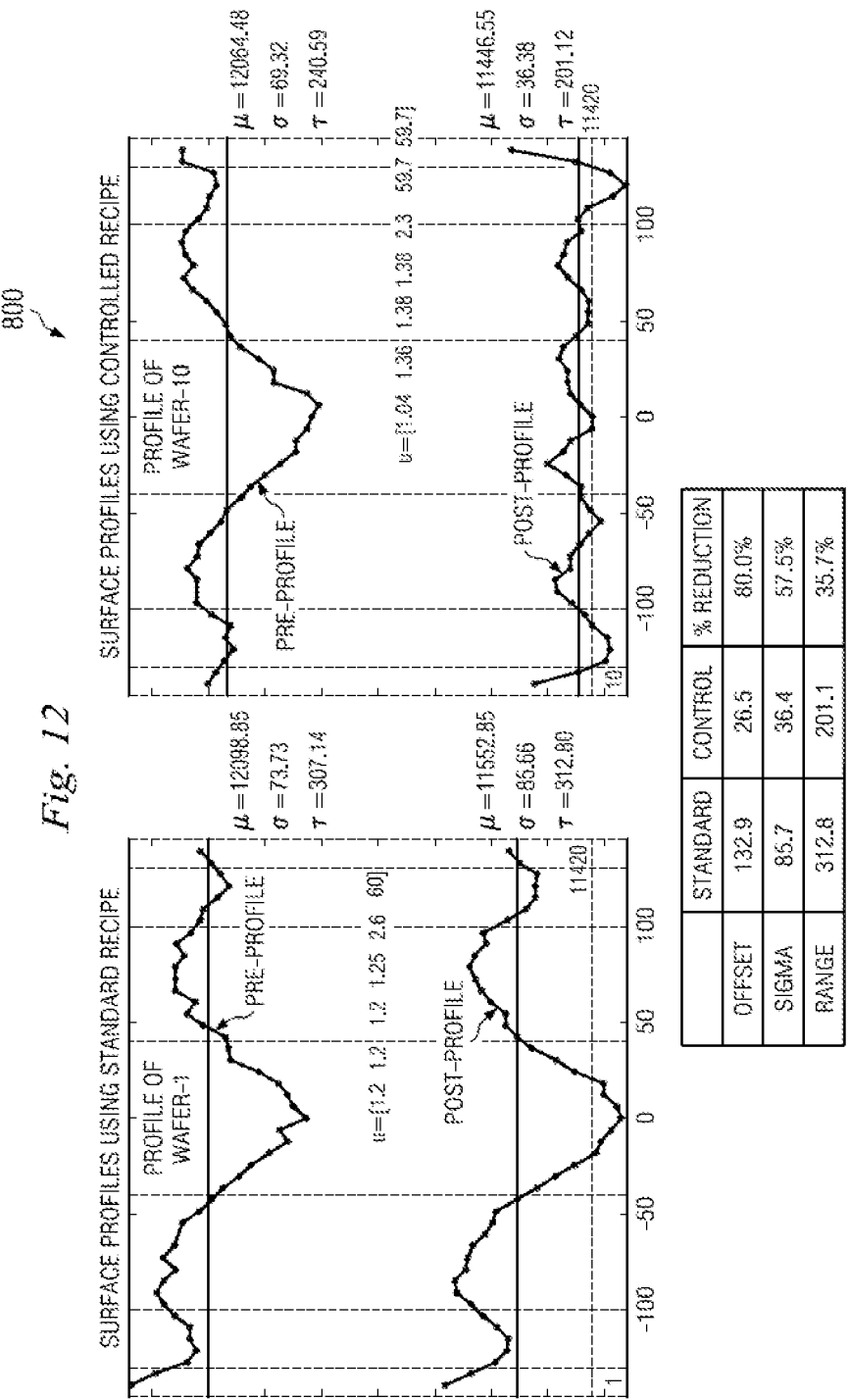
FIG. 12 is a graphical representation comparing a conventional CMP recipe to a CMP recipe derived according to aspects of the present disclosure.

The present apparatus and method for achieving target and profile control of a multi-head CMP process has been observed to provide improved within-wafer surface profile uniformity and improved wafer-to-wafer uniformity. For example, FIG. 12 illustrates pre-CMP surface profiles and post-CMP surface profiles of wafers polished using conventional CMP polishing recipes compared to pre-CMP surface profiles and post-CMP surface profiles of wafers polished using CMP polishing recipes derived from the methodology and system of the present disclosure. The CMP polishing recipes derived from the methodology and system disclosed herein provided improved post-CMP surface profiles. More specifically, compared to the post-CMP profiles arising from using CMP polishing recipes of conventional methods and systems, the disclosed method and system reduced an offset from the post-CMP surface profile from a target post-CMP surface profile by 80%, a standard deviation from the target post-CMP surface profile by 57.5%, and a range from the target post-CMP surface profile by 35.7%. Accordingly, the controlled CMP polishing recipes can reduce rework rates, improving cycle time. Different embodiments may have different advantages, and that no particular advantage is necessarily required of any embodiment.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a chemical mechanical polishing (CMP) tool having at least two wafer heads for polishing wafers; and
a controller in communication with the CMP tool, wherein the controller is configured to provide target thickness and surface profile uniformity control for the wafers by:
classifying surface profiles of at least two wafers, wherein each of the at least two wafers corresponds with one of the at least two wafer heads,
selecting an operation mode based on the classified surface profiles of the at least two wafers, wherein the operation mode is designated as a coupled mode where the at least two wafers are polished on a single polishing pad or a decoupled mode where the at least two wafers are polished on different polishing pads,
generating a CMP polishing recipe for each of the at least two wafer heads based on the operation mode, wherein the CMP polishing recipe accounts for interactions among the at least two wafer heads, and
performing a CMP process on the at least two wafers based on the operation mode and the generated CMP polishing recipe.

2. The apparatus of claim 1, wherein the coupled mode is selected, and wherein the controller is further configured to determine the CMP polishing recipe accounts for a polishing rate interaction between the at least two wafer heads, whereby a removal rate of a first wafer of the at least two wafers corresponding with a first wafer head of the at least two wafer heads depends on a polishing pressure imparted on a second wafer of the at least two wafers by a second wafer head of the at least two wafer heads during polishing on the single polishing pad.

3. The apparatus of claim 2, wherein the polishing pressure imparted on the second wafer is different from a polishing pressure imparted on the first wafer.

4. The apparatus of claim 1, further comprising a metrology tool configured to measure the surface profiles of the at least two wafers after the CMP process, and wherein the controller is further configured to modify, based on the measured surface profiles, a CMP control model used to generate the CMP polishing recipe.

5. The apparatus of claim 1, wherein the at least two wafer heads each include a plurality of independent pressure zones.

6. The apparatus of claim 5, wherein the controller is further configured to generate the CMP polishing recipe to account for a polishing rate interaction between a first pressure zone and a second pressure zone of the plurality of independent pressure zones, whereby a removal rate of the first pressure zone depends on a polishing pressure imparted by the second pressure zone.

7. The apparatus of claim 5, wherein the plurality of independent pressure zones are arranged concentrically around a pressure head center line.

8. The apparatus of claim 1, wherein the CMP polishing recipe defines at least one of the following for each of the at least two wafer heads: a mean pressure, a pressure profile, a polishing time, or a velocity.

9. A chemical-mechanical polishing (CMP) system comprising:
a base configured to receive at least one polishing pad;
a plurality of wafer heads each configured to receive a wafer and to polish the received wafer on the at least one polishing pad, wherein the plurality of wafer heads are further configured to polish received wafers on the at least one polishing pad concurrently, and wherein the plurality of wafer heads are further configured to apply independent polishing pressures while polishing the received wafers on the at least one polishing pad concurrently; and
a controller communicatively coupled to the plurality of wafer heads, wherein the controller is configured to:
classify surface profiles of the received wafers;
determine a polishing parameter for each of the plurality of wafer heads based on: the classified surface profiles and an interaction between the plurality of wafer heads, whereby a polishing rate associated with one of the plurality of wafer heads depends on pressure applied by the other of the plurality of wafer heads when polishing the received wafers on the at least one polishing pad concurrently; and
control the plurality of wafer heads to perform the polishing of the received wafers on the at least one polishing pad concurrently according to the polishing parameter.

10. The CMP system of claim 9, wherein the controller is further configured to determine the polishing parameter further based on at least one of a target thickness or a surface profile uniformity.

11. The CMP system of claim 9, wherein the polishing parameter for each of the plurality of wafer heads includes a polishing pressure and wherein a polishing pressure associated with one of the plurality of wafer heads is different from the polishing pressure associated with the other of the plurality of wafer heads.

12. The CMP system of claim 9 further comprising a metrology tool configured to determine a post-polishing surface profile of the received wafers after the polishing of the received wafers on the same polishing pad concurrently, wherein the controller is further configured to modify a control model used to determine the polishing parameter based on the post-polishing surface profile.

13. The CMP system of claim 9, wherein the polishing parameter includes at least one of: a mean pressure, a pressure profile, a polishing time, or a velocity.

14. The CMP system of claim 9, wherein each of the plurality of wafer heads includes a plurality of independent pressure zones each configured to provide an independent polishing pressure.

15. The CMP system of claim 14, wherein the plurality of independent pressure zones are arranged concentrically around a pressure head center line.

16. The CMP system of claim 14, wherein the controller is further configured to determine the polishing parameter further based on an interaction between a first pressure zone and a second pressure zone of the plurality of independent pressure zones, whereby a polishing rate associated with the first pressure zone depends on a pressure associated with the second pressure zone.

17. A wafer polishing apparatus comprising:
a controller configured to determine a polishing parameter to achieve at least one of a target thickness or a target surface profile uniformity of a first wafer and a second wafer, wherein the polishing parameter accounts for a removal rate effect on the first wafer due to a pressure applied to the second wafer when concurrently polishing the first wafer and the second wafer on a single polishing pad; and
a first wafer head and a second wafer head for concurrently polishing the first wafer and the second wafer, respectively, based on the polishing parameter, wherein the second wafer head and the first wafer head are configured to apply independent pressures respectively to the first wafer and the second wafer.

18. The wafer polishing apparatus of claim 17, wherein the polishing parameter includes a first pressure associated with the first wafer head and a second pressure associated with the second wafer head, and wherein the first pressure and the second pressure are different.

19. The wafer polishing apparatus of claim 17, wherein the polishing parameter includes at least one of: a mean pressure, a pressure profile, a polishing time, or a velocity.

20. The wafer polishing apparatus of claim 17, wherein each of the first wafer head and the second wafer head have a plurality of independent pressure zones, and wherein the determined polishing parameter further accounts for a removal rate interaction between the plurality of independent pressure zones.

\* \* \* \* \*